United States Patent
Lin

(10) Patent No.: US 9,300,278 B2
(45) Date of Patent: Mar. 29, 2016

(54) METHOD AND APPARATUS FOR CALIBRATING CMOS INVERTER

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 14/450,335

(22) Filed: Aug. 4, 2014

(65) Prior Publication Data

US 2016/0036419 A1 Feb. 4, 2016

(51) Int. Cl.
*H03K 3/02* (2006.01)
*H03K 3/037* (2006.01)
*H03K 3/356* (2006.01)

(52) U.S. Cl.
CPC ........ *H03K 3/0375* (2013.01); *H03K 3/356104* (2013.01)

(58) Field of Classification Search
CPC .................................................. H03K 3/0375
See application file for complete search history.

(56) References Cited

U.S. PATENT DOCUMENTS

| | | | | |
|---|---|---|---|---|
| 5,471,498 A | * | 11/1995 | Kuo | H03K 5/151 330/310 |
| 5,929,662 A | * | 7/1999 | Alexander | H03K 5/249 327/198 |
| 2014/0266445 A1 | * | 9/2014 | Albinet | H03F 3/45636 330/260 |

* cited by examiner

*Primary Examiner* — Daniel Puentes
(74) *Attorney, Agent, or Firm* — McClure, Qualey & Rodack, LLP

(57) ABSTRACT

A circuit and method for calibrating CMOS (complementary metal-oxide semiconductor) inverters are provided. In a circuit, a first tunable CMOS inverter, controlled by a control signal, receives a first voltage from a first circuit node and outputs a second voltage to a second circuit node. A second tunable CMOS inverter, controlled by the control signal, receives the second voltage from the second circuit node and outputs the first voltage to the first circuit node. A resistor couples the first circuit node to the second circuit node. A switch, controlled by a reset signal, conditionally shorts the first circuit node to the second circuit node. A finite state machine receives the first voltage and the second voltage and outputs the reset signal and the control signal, wherein the control signal is adjusted based on a difference between the first voltage and the second voltage.

19 Claims, 3 Drawing Sheets

METHOD AND APPARATUS FOR CALIBRATING CMOS INVERTER

BACKGROUND OF THE INVENTION

1. Field of the Invention

The present invention generally relates to CMOS (complimentary metal oxide semiconductor) inverter circuits and more particularly to a method and apparatus for calibrating CMOS inverter circuits.

2. Description of Related Art

Persons of ordinary skill in the art understand terms and basic concepts related to microelectronics that are used in this disclosure, such as MOS (metal-oxide semiconductor) transistor, PMOS (p-channel MOS) transistor, NMOS (n-channel MOS) transistor, CMOS, "operational amplifier," "common-mode," "differential-mode" "transconductance," "output resistance" "gate," "source," "drain," "saturation region," "trip point," "bulk," "cascode," "switch," "voltage," "current," "circuit," "circuit node," "power supply," "ground," "rail," "latch," "negative resistance," and "inverter". Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained in detail here.

CMOS inverters can be used to embody an operational amplifier. As shown in FIG. 1, an inverter-based operational amplifier 100 comprises: CMOS inverter 111 for receiving voltage VA and output voltage VC; CMOS inverter 112 for receiving voltage VB and output voltage VD; and a latch circuit 130 comprising cross-coupling CMOS inverters 131 and 132 for providing a cross-coupling between VA and VB. The latch circuit 130 is introduced to provide a negative resistance between circuit nodes 101 and 102 to compensate for an otherwise resistive load 120 seen between circuit nodes 101 and 102. The principle of inverter-based operational amplifier is well described by Zeller et al in "A 0.039 mm 2 inverter-based 1.82 mW 68.6 dB-SNDR 10 MHz-BW CT-ΣΔ-ADC in 65 nm CMOS," IEEE Journal of Solid-State Circuits, VOL. 49, NO. 7, July 2014, and thus not described in details here.

For an inverter-based operational amplifier 100 to have high performance, the negative resistance provided by the latch circuit 130 must match well with the otherwise resistive load 120. A calibration is needed to tune the CMOS inverters 131 and 132 within the latch circuit 130 to ensure the negative resistance that the latch circuit 130 provides matches well with the resistive load 120. Although Zeller et at in the aforementioned paper taught a method to calibrate CMOS inverters 131 and 132, the method is based on a "common-mode" calibration scheme, where a common-mode signal is injected into both circuit nodes 101 and 102 (to make $V_A$ and $V_B$ both change in the same direction by the same amount) and a resultant mean value of $V_C$ and $V_D$ is observed and used as a basis for tuning CMOS inverters 131 and 132. In actual applications, however, what is of interest is a "differential-mode" signal, where $V_A$ and $V_B$ change in opposite directions.

A CMOS inverter comprises a NMOS transistor and a PMOS transistor. When operating in the "saturation region" as an amplifier, a MOS transistor, either PMOS or NMOS, behaves as a transconductance device with a finite output resistance; the output resistance is often neglected and assumed infinite for ease of analysis but needs to be considered if one seeks to perform an accurate calibration. In a common-mode input scenario, $V_A$ and $V_B$ both change in the same direction with the same amount; in this case, both the transconductance and the output resistance of every MOS device within CMOS inverters 131 and 132 react to resist that change. In a differential-mode input scenario, $V_A$ and $V_B$ change in opposite directions; in this case, the transconductance (of every MOS device within CMOS inverters 131 and 132) reacts to assist the change while the output resistance (of every MOS device within CMOS inverters 131 and 132) still reacts to resist the change. In other words, the output resistance effectively enhances the transconductance in the common-mode input scenario, but effectively weakens the transconductance in the differential-mode input scenario. The calibration scheme taught by Zeller et al, neglects the effect of the output resistance, and thus is not accurate for the differential-mode operation of interest.

BRIEF SUMMARY OF THIS INVENTION

An objective of this present invention is to calibrate a tunable CMOS inverter so that two of such tunable CMOS inverters, configured in a cross-coupling topology, provide a negative resistance that accurately offsets a resistance of a resistor.

An objective of this present invention is to calibrate a tunable CMOS inverter using a differential-mode signaling scheme so that two of such tunable CMOS inverters, configured in a cross-coupling topology, provide a negative resistance that accurately offsets a resistance of a resistor in a differential-mode input scenario.

An objective of this present invention is to calibrate two tunable CMOS inverters configured in a cross-coupling topology so that the two tunable CMOS inverters provide a negative resistance that accurately offsets a resistance of a resistor under a differential-mode signaling scenario.

In an embodiment, a method comprises the following steps: (A) incorporating a first tunable CMOS inverter controlled by a control signal for receiving a first voltage from a first circuit node and outputting a second voltage to a second circuit node; (B) incorporating a second tunable CMOS inverter controlled by the control signal for receiving the second voltage from the second circuit node and outputting the first voltage to the first circuit node; (C) incorporating a resistor for coupling the first circuit node to the second circuit node; (D) incorporating a switch controlled by a reset signal for conditionally shorting the first circuit node to the second circuit node; (E) asserting the reset signal to turn on the switch to equalize the first voltage and the second voltage to a trip point; (F) de-asserting the reset signal to turn off the switch to allow the first voltage and the second voltage to develop a difference between the first voltage and the second voltage; (G) adjusting the control signal in accordance with a state of the difference between the first voltage and the second voltage; and (H) looping back to step (E).

In an embodiment, a circuit comprises: a first tunable CMOS inverter controlled by a control signal receiving a first voltage from a first circuit node and outputting a second voltage to a second circuit node; a second tunable CMOS inverter controlled by the control signal receiving the second voltage from the second circuit node and outputting the first voltage to the first circuit node; a resistor coupling the first circuit node to the second circuit node; a switch controlled by a reset signal conditionally shorting the first circuit node to the second circuit node; and a finite state machine for receiving the first voltage and the second voltage and outputting the reset signal and the control signal. The control signal is used to control a transconductance of a MOS transistor within the first tunable CMOS inverter and a transconductance of a MOS transistor within the second tunable CMOS inverter. The finite state machine incrementally adjusts the control signal in an iterative process by cyclically asserting the reset signal, de-asserting the reset signal, and identifying a needed adjustment based on a difference between the first voltage and the second voltage.

DETAILED DESCRIPTION OF THE DRAWINGS

FIG. 1 shows a schematic diagram of an inverter-based operational amplifier.

FIGS. 2A and 2B (collectively referred to as FIG. 2) show a schematic diagram of a circuit in accordance with an embodiment of the present invention.

DETAILED DESCRIPTION OF THIS INVENTION

The present invention relates to CMOS inverter. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Throughout this disclosure: "VDD" denotes a power supply node of a power supply (voltage) level; a ground symbol denotes a ground node of a ground (voltage) level; a CMOS inverter comprises a PMOS transistor, of which a source terminal is connected to the power supply node, a gate terminal is connected to an input of the CMOS inverter, and a drain terminal is coupled to an output of the CMOS inverter, and a NMOS transistor, of which a source terminal is connected to the ground node, a gate terminal is connected to the input of the CMOS inverter, and a drain terminal is coupled to the output of the CMOS inverter; a signal is deemed "high" when its voltage level is sufficiently higher than a "trip point" so that it can be reliably identified as logically high, is deemed "low" when its voltage level is sufficiently lower than the "trip point" so that it can be reliably identified as logically low. The "trip point" is a voltage level of the output of the CMOS inverter when the CMOS inverter is configured in a stand-alone self-feedback topology, wherein the output is shorted to the input of the CMOS inverter. By way of example but not limitation: a power supply level is 1V; a ground level is 0V; a "trip point" is approximately equal to a mean level between the power supply level and the ground level (i.e. 0.5V); a signal is deemed "high" when its voltage level is higher than a mean level between the power supply level and the trip point (i.e., 0.75V); a signal is deemed low when its voltage level is lower than a mean level between the trip point and the ground level (i.e., 0.25V); and a signal is deemed ambiguous when it is neither "high" nor "low" (i.e., between 0.25V and 0.75V).

Figure 1:
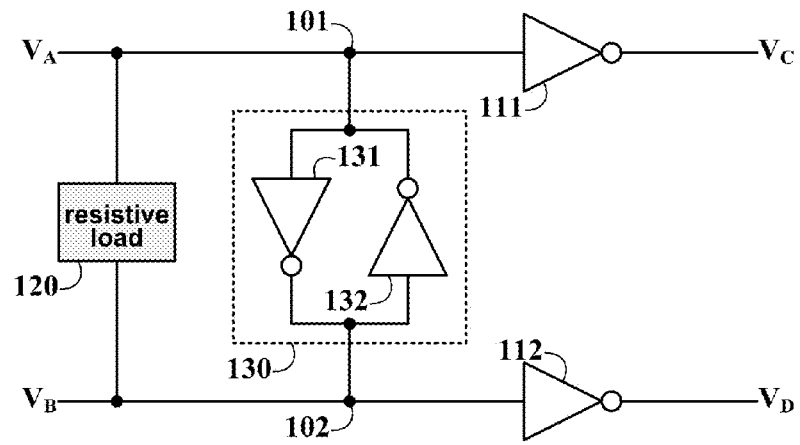
Figure 2A:
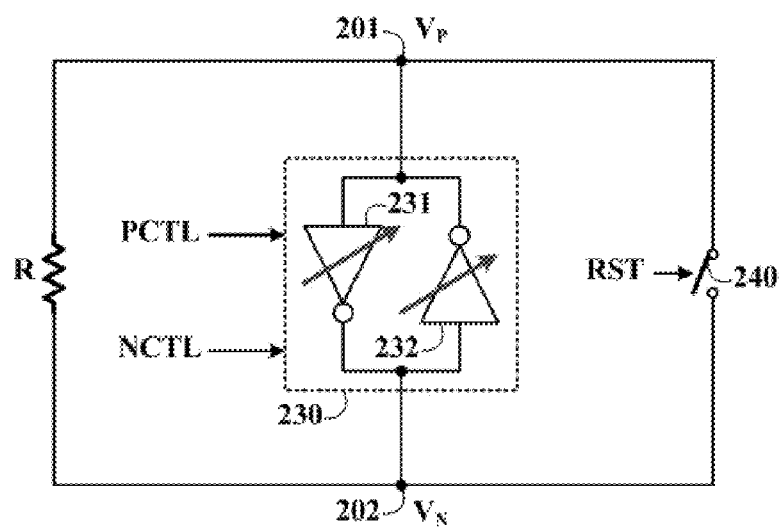
Figure 2B:
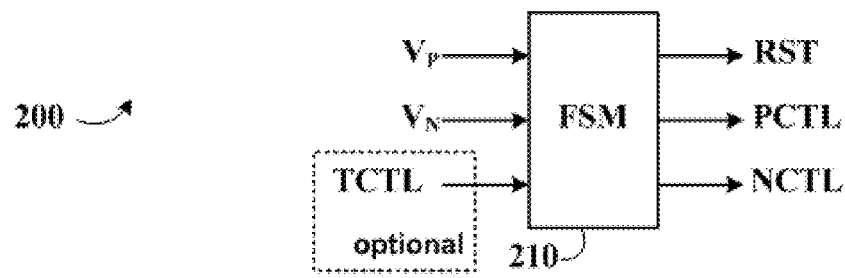

As depicted in FIG. 2, a circuit 200 in accordance with an embodiment of the present invention comprises: a resistor R inserted between a first circuit node 201 and a second circuit node 202; a tunable latch 230, controlled by a first control signal PCTL and a second control signal NCTL, comprising a first tunable CMOS inverter 231 and a second tunable CMOS inverter 232 configured in a cross-coupling topology, also inserted between the first circuit node 201 and the second circuit node 202; a switch 240 controlled by a reset signal RST, also inserted between the first circuit node 201 and the second circuit node 202; and a finite state machine (FSM) 210 for receiving a first voltage VP at the first circuit node 201, a second voltage VN at the second circuit node 202, and an optional third control signal TCTL, and outputting and the reset signal RST, the first control signal PCTL, and the second control signal NCTL. The tunable latch 230 provides a tunable negative resistance controlled by PCTL and NCTL. FSM 210 incrementally adjusts PCTL or NCTL in a closed loop manner in an iterative process so as to make the negative resistance provided by the tunable latch 230 match a resistance of the resistor R. For each iteration in the iterative process, the reset signal RST is first asserted to effectively short the first circuit node 201 to the second circuit node 202 to equalize VP and VN to the trip point of tunable CMOS inverters 231 and 232; the reset signal RST is then de-asserted to allow VP and VN to develop a difference: they either remain ambiguous (i.e., neither sufficiently higher nor sufficiently lower than the trip point) or diverge in opposite directions towards rails (either the power supply level or the ground level), depending on the relative strength between the tunable latch 230 and the resistor R. If VP and VN remain ambiguous and unable to develop a large difference, it indicates that the negative resistance provided by the tunable latch 230 is weaker than the resistance of the resistor R and thus unable to overcome the resistance of the resistor R; in this case, PCTL or NCTL will be adjusted by FSM 210 to strengthen the negative resistance provided by the tunable latch 230.

If VP and VN develop a large difference and diverge in opposite directions to become either high and low or low and high, respectively, it indicates that the negative resistance provided by the tunable latch 230 is stronger than the resistance of the resistor R; in this case, PCTL or NCTL will be adjusted by FSM 210 to weaken the negative resistance provided by the tunable latch 230. In this manner, the negative resistance provided by tunable latch 230 is adjusted incrementally and iteratively by FSM 210 in a closed loop manner to match the resistance of the resistor R.

It should be understood that, in this disclosure, a negative resistance provided by a latch is said to be stronger (weaker) if the value of the negative resistance is less (more) negative. For instance, a negative resistance of −100 Ohm is said to be stronger than a negative resistance of −200 Ohm. Also, a latch is said to be stronger (weaker) if a negative resistance it provides is stronger (weaker). In addition, it should be understood that, in this disclosure, when a negative resistance provided by a latch is said to match a resistance of a resistor, it means that the negative resistance provided by the latch offsets the resistance of the resistor. For instance, if the negative resistance provided by the latch circuit is −100 Ohm, it is said to match the resistance of a 100 Ohm resistor.

Although VP and VN are initially equalized to the trip point of tunable CMOS inverters 231 and 232 due to the asserting of the reset signal RST, a noise, which is unavoidable in a practical circuit, within circuit 200 will always introduce a difference between VP and VN after the reset signal RST is de-asserted. If the negative resistance provided by the tunable latch 230 is stronger than the resistance of the resistor R, the difference will be self-enhancing, resulting in VP and VN diverging to either high and low or low and high, respectively. Although a noise is prevalent in a circuit, the level of the noise might be random. To ensure that VP and VN can always promptly develop a difference and quickly diverge (in the event where the negative resistance provided by the tunable latch 230 is stronger than the resistance of the resistor R), a further embodiment (not shown in FIG. 2 but will be obvious to those of ordinary skill in the art) comprises: briefly injecting a first noises into circuit node 201 and a second noise of an opposite polarity into circuit 200 after the reset signal RST is de-asserted; this will help to jump-start the self-enhancing of the difference between $V_P$ and $V_N$. In an embodiment, a noise of 10 mV is injected into circuit node 201 and a noise of −10 mV is injected into circuit node 202 briefly after the reset signal RST is de-asserted.

In contrast to the calibration method taught by Zeller et at in the aforementioned paper, circuit 200 is based on the differential-mode signaling, where the negative resistance of the tunable latch 230 will force VP and VN to change in opposite directions, albeit the negative resistance may not be sufficiently strong to make them diverge sufficiently away from the trip point. The present invention, therefore, allows a more accurate calibration then the calibration method taught by Zeller et al.

Figure 3:
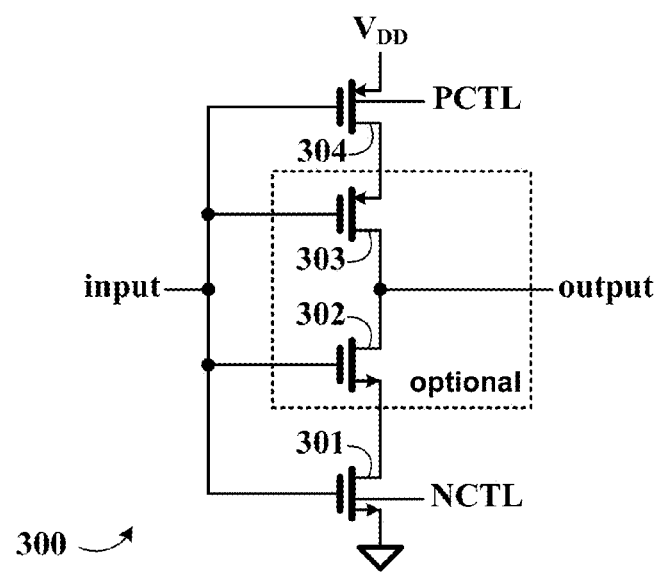
FIG. 3 shows a schematic diagram of a tunable CMOS inverter suitable for use by the circuit of FIG. 2 in accordance with an embodiment of the present invention.

A schematic diagram of a tunable CMOS inverter 300 suitable for embodying tunable CMOS inverters 231 and 232 of the tunable latch 230 in FIG. 2 is depicted in FIG. 3. Tunable CMOS inverter 300 comprises: a PMOS transistor 304 with a bulk terminal connected to the first control signal PCTL; and a NMOS transistor 301 with a bulk terminal connected to the second control signal NCTL. The input to the tunable CMOS inverter 300 is coupled to the gate terminals of NMOS transistor 301 and PMOS transistor 304, while the output of the tunable CMOS inverter 300 is tapped from the drain terminals of NMOS transistor 301 and PMOS transistor 304. The tunable CMOS inverter 300 further comprises an optional PMOS transistor 303 serving as a cascode device for PMOS transistor 304 and an optional NMOS transistor 302 serving as a cascode device for NMOS transistor 301; purposes, design considerations, and methods of biasing of a cascode device are well known in prior art and thus not described in detail here.

As also known in prior art, an increase (decrease) of a bulk voltage of a NMOS transistor increases (decreases) a transconductance of the NMOS transistor, while an increase (decrease) of a bulk voltage of a PMOS transistor decreases (increases) a transconductance of the PMOS transistor; a higher transconductance of either the PMOS transistor or the NMOS transistor of a CMOS inverter leads to a stronger negative resistance when two of such CMOS inverters are configured in a cross-coupling topology to form a latch. Therefore, when the negative resistance provided by the tunable latch 230 of FIG. 2 needs to be strengthened (weakened), either the first control signal PCTL needs to be decreased (increased), or the second control signal NCTL needs to be increased (decreased).

On the other hand, the increase (decrease) of the bulk voltage of the PMOS transistor lowers (raises) the trip point of the CMOS inverter built by the PMOS transistor, and also the increase (decrease) of the bulk voltage of the NMOS transistor lowers (raises) the trip point of the CMOS inverter built by the NMOS transistor. In case the change of the trip point is not an issue as far as an application of interest is concerned, one can choose to increase (decrease) NCTL, or decrease (increase) PCTL, or concurrently increase (decrease) NTCL and decrease (increase) PCTL, when the negative resistance provided by the tunable latch 230 of FIG. 2 needs to be strengthened (weakened). In case the change of trip point is an issue as far as an application of interest is concerned, one must adjust the first control signal PCTL and the second control signal NCTL so as to ensure the trip point changes in a desired direction. Now refer back to FIG. 2.

The optional third control signal TCTL received by FSM 210 is used for adjusting the first control signal PCTL or the second control signal NCTL, so that the trip point of tunable CMOS inverters 231 and 232 changes in a desired direction. The third control signal TCTL is generated by a trip point detection circuit (not shown in FIG. 2); the trip point detection circuit detects the trip point (of tunable CMOS inverters 231 and 232) and generates the third control signal TCTL accordingly. In an embodiment, the third control signal TCTL is a logical signal indicating whether the trip point is higher or lower than a desired level; if TCTL is 1 (0), it indicates that the trip point is higher (lower) than desired and needs to be lowered (raised). In one embodiment, the trip point detection circuit compares the trip point of tunable CMOS inverters 231 and 232 with a desired level and thus determining whether the trip point is higher or lower than desired. In an alternative embodiment, the method of determining whether the trip point is higher or lower than desired taught by Zeller et at in the aforementioned paper is used. In one embodiment, a logical table shown in Table 1 is used by FSM 210 for adjusting PCTL and NTCL in accordance with $V_P$, $V_N$, and TCTL:

TABLE 1

| TCTL | $V_P$ and $V_N$ do not develop a large difference and remain ambiguous | $V_P$ and $V_N$ develop a large difference and diverge to either high and low or low and high, respectively |
|---|---|---|
| 1 (the trip point is higher than desired) | Increase NCTL | Increase PCTL |
| 0 (the trip point is lower than desired) | Decrease PCTL | Decrease NCTL |

Once the PCTL and NCTL are incrementally adjusted and established to make the negative resistance provided by tunable latch 230 match the resistance of the resistor R, the settings of PCTL and NCTL are applicable for all tunable CMOS inverters that are built from the same circuit.

In an embodiment, the first control signal PCTL is generated from a first DAC (digital-to-analog converter) controlled by a first control code, while the second control signal NCTL is generated from a second DAC controlled by a second control code, and FSM 210 adjusts PCTL via an update, which is either an increment or a decrement, to the first control code, and adjusts NCTL via an update, which is either an increment or a decrement, to the second control code.

Now refer to FIG. 3. In an alternative embodiment not shown in the figure but will be obvious to those of ordinary skill in the art by text descriptions, the bulk terminal of the NMOS transistor 301 is connected to the ground node (instead of NCTL), the bulk terminal of the PMOS transistor 304 is connected to the power supply node VDD, and PCTL and NCTL are consolidated into a single control signal that controls the voltage level of the power supply node VDD. As known in prior art, an increase (decrease) of the power supply level for a CMOS inverter leads to an increase (decrease) of transconductance for both the PMOS transistor and the NMOS transistor therein. This alternative embodiment is suitable for an application wherein a change of the trip point of the CMOS inverter is not an issue.

Figure 4:
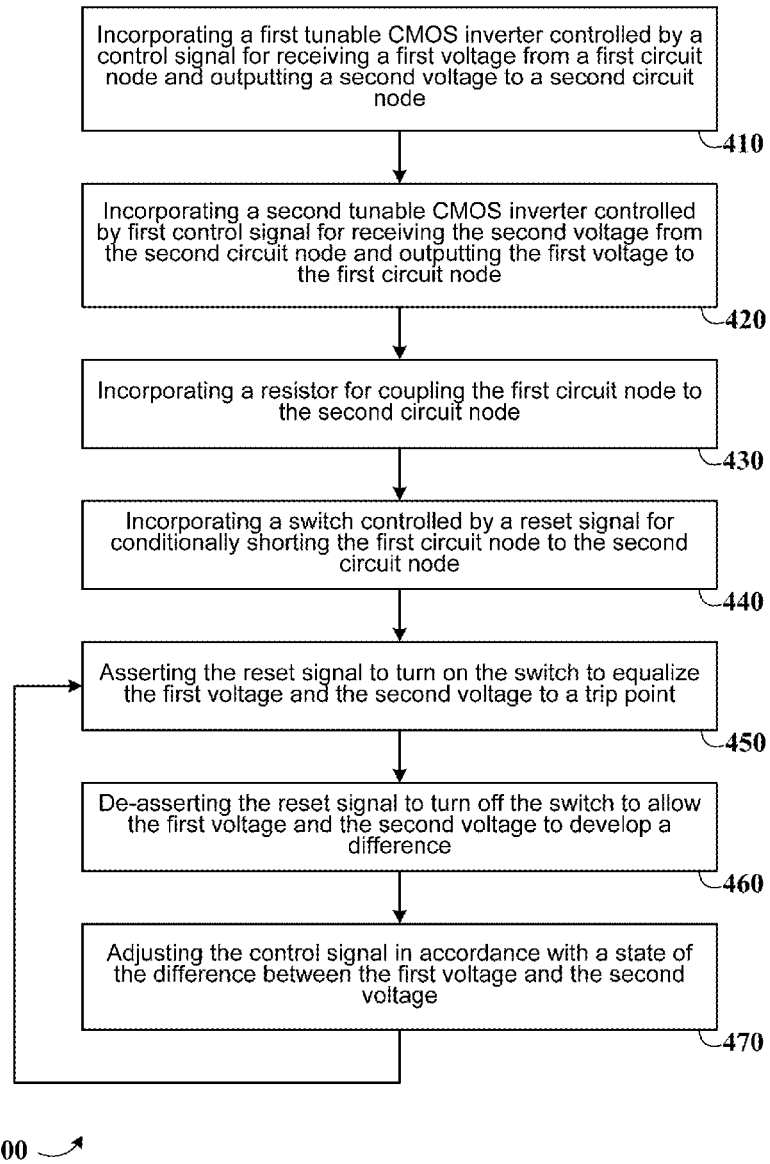
FIG. 4 shows a flow diagram of a method in accordance with an embodiment of the present invention.

In an embodiment illustrated by a flow diagram shown in FIG. 4, a method 400 comprises: (1) step 410: incorporating a first tunable CMOS inverter controlled by a control signal for receiving a first voltage from a first circuit node and outputting a second voltage to a second circuit node; (2) step 420: incorporating a second tunable CMOS inverter controlled by the control signal for receiving the second voltage from the second circuit node and outputting the first voltage to the first circuit node; (3) step 430: incorporating a resistor for coupling the first circuit node to the second circuit node; (4) step 440: incorporating a switch controlled by a reset signal for conditionally shorting the first circuit node to the second circuit node; (5) step 450: asserting the reset signal to turn on the switch to equalize the first voltage and the second voltage to a trip point; (6) step 460: de-asserting the reset signal to turn off the switch to allow the first voltage and the second voltage to develop a difference; (7) step 470: adjusting the control signal in accordance with a state of the difference between the first voltage and the second voltage; and (8) looping back to step 450.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   a first tunable CMOS (complementary metal-oxide semiconductor) inverter, controlled by a control signal, receiving a first voltage from a first circuit node and outputting a second voltage to a second circuit node;
   a second tunable CMOS inverter, controlled by the control signal, receiving the second voltage from the second circuit node and outputting the first voltage to the first circuit node;
   a resistor coupling the first circuit node to the second circuit node;
   a switch controlled by a reset signal conditionally shorting the first circuit node to the second circuit node; and
   a finite state machine receiving the first voltage and the second voltage and outputting the reset signal and the control signal, wherein the control signal is adjusted based on a difference between the first voltage and the second voltage.

2. The circuit of claim 1, wherein: the control signal is used to control a transconductance of a MOS (metal-oxide semiconductor) transistor within the first tunable CMOS inverter and a transconductance of a MOS transistor within the second tunable CMOS inverter.

3. The circuit of claim 2, wherein the finite state machine incrementally adjusts the control signal in an iterative process comprising numerous iterations.

4. The circuit of claim 3, wherein during a first step of each iteration of said iterations the finite state machine asserts the reset signal to short the first circuit node to the second circuit node to equalize the first voltage and the second voltage to a trip point.

5. The circuit of claim 4, wherein during a second step of the iteration the finite state machine de-asserts the reset signal to allow the first voltage and the second voltage to develop the difference therebetween.

6. The circuit of claim 5, wherein the difference is deemed large if one of the first voltage and the second voltage rises to a level that is reliably identified as logically high and the other one falls to a level that is reliably identified as logically low, wherein the control signal is adjusted in response to the difference between the first voltage and the second voltage being determined to be large.

7. The circuit of claim 6, wherein during a third step of the iteration the finite state machine adjusts the control signal to enforce an increment to the transconductance of the MOS transistor within the first tunable CMOS inverter and to the transconductance of the MOS transistor within the second tunable CMOS inverter if the first voltage and the second voltage fail to develop a large difference.

8. The circuit of claim 7, wherein during the third step of the iteration the finite state machine adjusts the control signal to enforce a decrement to the transconductance of the MOS transistor within the first tunable CMOS inverter and to the transconductance of the MOS transistor within the second tunable CMOS inverter if the first voltage and the second voltage develop a large difference.

9. The circuit of claim 3, wherein the control signal determines a voltage of a bulk terminal of the MOS transistor within the first tunable CMOS inverter and a voltage of a bulk terminal of the MOS transistor within the second tunable CMOS inverter.

10. The circuit of claim 9, wherein the control signal is generated by a digital-to-analog converter controlled by a control code.

11. The circuit of claim 10, wherein the finite state machine adjusts the control signal by issuing an update of either increment or decrement to the control code.

12. A method comprising the following steps:
   (A) incorporating a first tunable CMOS (complementary metal-oxide semiconductor) inverter controlled by a control signal for receiving a first voltage from a first circuit node and outputting a second voltage to a second circuit node;
   (B) incorporating a second tunable CMOS inverter controlled by the control signal for receiving the second voltage from the second circuit node and outputting the first voltage to the first circuit node;
   (C) incorporating a resistor for coupling the first circuit node to the second circuit node;
   (D) incorporating a switch controlled by a reset signal for conditionally shorting the first circuit node to the second circuit node;
   (E) asserting the reset signal to turn on the switch to equalize the first voltage and the second voltage to a trip point;
   (F) de-asserting the reset signal to turn off the switch to allow the first voltage and the second voltage to develop a difference between the first voltage and the second voltage;
   (G) adjusting the control signal based on the difference between the first voltage and the second voltage; and
   (H) looping back to step (E).

13. The method of claim 12, wherein the control signal controls a transconductance of a MOS (metal-oxide semiconductor) transistor within the first tunable CMOS inverter and a transconductance of a MOS transistor within the second tunable CMOS inverter.

14. The method of claim 13, wherein the difference is deemed large if one of the first voltage and the second voltage rises to a level that is reliably identified as logically high and the other one falls to a level that is reliably identified as logically low.

15. The method of claim 14, wherein in step (G) the control signal is adjusted to enforce an increment to the transconductance of the MOS transistor within the first tunable CMOS inverter and to the transconductance of the MOS transistor within the second tunable CMOS inverter if the first voltage and the second voltage fail to develop a large difference.

16. The method of claim 15, wherein in step (G) the control signal is adjusted to enforce a decrement to the transconductance of the MOS transistor within the first tunable CMOS inverter and to the transconductance of the MOS transistor within the second tunable CMOS inverter if the first voltage and the second voltage develop a large difference.

17. The method of claim 16, wherein the control signal determines a voltage of a bulk terminal of the MOS transistor within the first tunable CMOS inverter and a voltage of a bulk terminal of the MOS transistor within the second tunable CMOS inverter.

18. The method of claim 17, wherein the control signal is generated by a digital-to-analog converter controlled by a control code.

19. The method of claim 18, wherein the control signal is adjusted by an issuing up update of either increment or decrement to the control code.

* * * * *